United States Patent
Sugiyama et al.

(10) Patent No.: US 9,482,890 B2
(45) Date of Patent: Nov. 1, 2016

(54) LIQUID CRYSTAL DISPLAY DEVICE AND ELECTRONIC APPARATUS

(71) Applicant: Japan Display Inc., Tokyo (JP)

(72) Inventors: Hiroki Sugiyama, Tokyo (JP); Hiroshi Inamura, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/564,316

(22) Filed: Dec. 9, 2014

(65) Prior Publication Data

US 2015/0168760 A1    Jun. 18, 2015

(30) Foreign Application Priority Data

Dec. 17, 2013   (JP) .................................. 2013-260579

(51) Int. Cl.
  *G02F 1/133*   (2006.01)
  *G02F 1/1368*   (2006.01)
  *G02F 1/1343*   (2006.01)
  *G02F 1/1333*   (2006.01)

(52) U.S. Cl.
  CPC ......... *G02F 1/13306* (2013.01); *G02F 1/1368* (2013.01); *G02F 1/133345* (2013.01); *G02F 1/134336* (2013.01)

(58) Field of Classification Search
  CPC ............. G02F 1/13306; G02F 1/1368; G02F 1/134336; G02F 1/133345
  See application file for complete search history.

(56) References Cited

U.S. PATENT DOCUMENTS

| | | | |
|---|---|---|---|
| 2003/0071309 A1 | 4/2003 | Yamanaka et al. | |
| 2010/0244029 A1 | 9/2010 | Yamazaki et al. | |
| 2011/0090436 A1* | 4/2011 | Choi | G02F 1/13306 349/106 |
| 2014/0063393 A1* | 3/2014 | Zhong | G02F 1/13306 349/42 |
| 2014/0307187 A1* | 10/2014 | Hsiao | G09G 3/003 349/15 |
| 2014/0307189 A1* | 10/2014 | Yim | G02F 1/133345 349/33 |
| 2015/0055051 A1* | 2/2015 | Osawa | H01L 27/1225 349/48 |
| 2015/0206944 A1* | 7/2015 | Riedel | G02F 1/1345 257/774 |
| 2015/0301415 A1* | 10/2015 | Sawada | G11C 19/28 349/147 |

FOREIGN PATENT DOCUMENTS

| | | |
|---|---|---|
| JP | 2000-111945 | 4/2000 |
| JP | 2004-004553 | 1/2004 |
| JP | 2008-197359 | 8/2008 |
| JP | 2010-251735 | 11/2010 |

OTHER PUBLICATIONS

Japanese Office Action issued Aug. 30, 3016 in corresponding Japanese Application No. 2013-260579.

* cited by examiner

*Primary Examiner* — Anne Hines
*Assistant Examiner* — Jose M Diaz
(74) *Attorney, Agent, or Firm* — K&L Gates LLP

(57) ABSTRACT

A liquid crystal display device including a first substrate, a second substrate disposed so as to face the first substrate and a liquid crystal layer disposed between the first and the second substrates, the first substrate including: a display area portion in which a plurality of pixels are arranged in a manner of a matrix; and a frame edge area lying outside the display area portion, the frame edge area including a peripheral circuit configured to drive the plurality of pixels of the display area portion, the peripheral circuit having at least one transistor, wherein a channel area of the transistor is covered with a conductive layer via an inorganic insulating layer, the inorganic insulating layer and the conductive layer being stacked in a direction orthogonal to a surface of the first substrate in the stated order, and a predetermined negative potential is applied to the conductive layer.

3 Claims, 8 Drawing Sheets

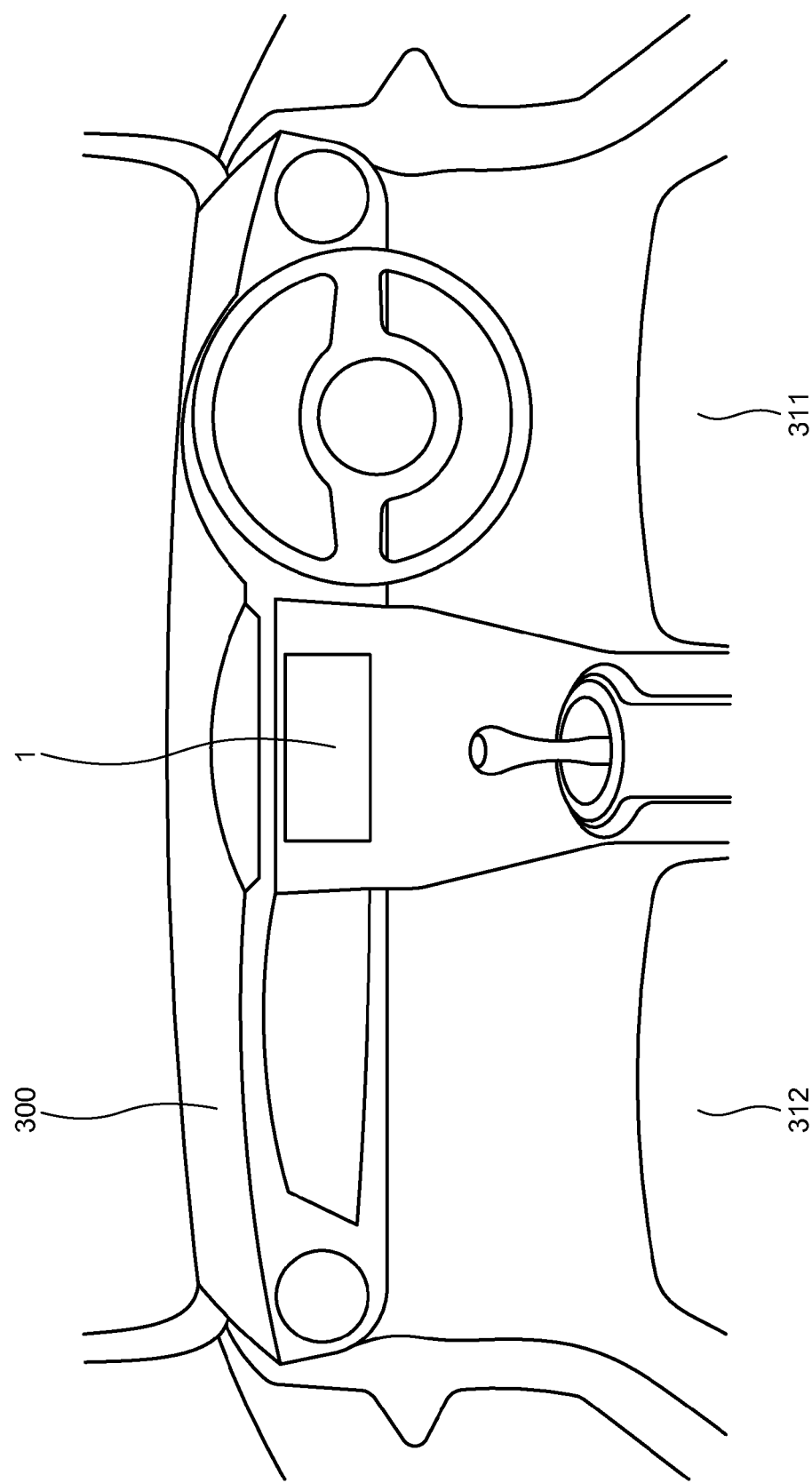

LIQUID CRYSTAL DISPLAY DEVICE AND ELECTRONIC APPARATUS

CROSS REFERENCES TO RELATED APPLICATIONS

The present application claims priority to Japanese Priority Patent Application JP 2013-260579 filed in the Japan Patent Office on Dec. 17, 2013, the entire content of which is hereby incorporated by reference.

BACKGROUND

1. Field of the Invention

The present invention relates to a liquid crystal display device, and an electronic apparatus that includes the liquid crystal display device.

2. Description of the Related Art

Recent years have seen a growing demand for liquid crystal display devices for use in display apparatuses of automotive navigation systems and display apparatuses of mobile devices, such as mobile phones and electronic paper.

Japanese Patent Application Laid-open Publication No. 2008-197359 (JP-A-2008-197359) discloses a technology of reducing display unevenness by preventing light leakage to a thin-film transistor (TFT) and correcting variations in characteristics of the TFT.

In JP-A-2008-197359, an electrically conductive light shielding layer is provided on an array substrate, and the TFT is provided on an upper layer thereof with an insulating film interposed therebetween. It is disclosed that, as a result of such an aspect, applying a negative voltage to the light shielding layer corrects the characteristics of the TFT and increases a threshold voltage, and thereby can improve the display unevenness caused by the leakage occurring when the TFT is turned off. Such an effect is, however, obtained for TFTs of a display area portion. No consideration is given to transistors in a peripheral circuit provided in a frame edge area that drive the TFTs of the display area portion.

The transistors in the peripheral circuit provided in the frame edge area are required to malfunction less frequently when operating for a longer time than the transistors of the display area portion.

SUMMARY

According to an aspect of the invention, a liquid crystal display device including a first substrate, a second substrate disposed so as to face the first substrate and a liquid crystal layer disposed between the first and the second substrates is provided. The first substrate includes: a display area portion in which a plurality of pixels are arranged in a manner of a matrix; and a frame edge area lying outside the display area portion, the frame edge area including a peripheral circuit configured to drive the plurality of pixels of the display area portion, the peripheral circuit having at least one transistor, wherein a channel area of the transistor is covered with a conductive layer via an inorganic insulating layer, the inorganic insulating layer and the conductive layer being stacked in a direction orthogonal to a surface of the first substrate in the stated order, and a predetermined negative potential is applied to the conductive layer.

According to another aspect of the invention, an electronic apparatus is provided. The electronic apparatus includes: the liquid crystal display device above mentioned; and a control device configured to supply an image signal to the liquid crystal display device, and configured to control operations of the liquid crystal display device.

Additional features and advantages are described herein, and will be apparent from the following Detailed Description and the figures.

BRIEF DESCRIPTION OF THE FIGURES

FIG. 11 is a diagram illustrating an example of an electronic apparatus to which the liquid crystal display device according to the present embodiment is applied.

DETAILED DESCRIPTION

An embodiment for practicing the present invention will be described in detail with reference to the accompanying drawings. The description of the embodiment below will not limit the present invention. The constituent elements described below include elements easily envisaged by those skilled in the art and substantially identical elements. The constituent elements described below can also be combined as appropriate. The disclosure is merely an example, and the scope of the present invention naturally includes appropriate modifications easily envisaged by those skilled in the art while maintaining the gist of the invention. In order to make the description clearer, the drawings may more schematically illustrate, for example, widths, thicknesses, and shapes of various parts than those in the actual state. However, those are mere examples, and do not limit interpretation of the present invention. In this specification and the drawings, the same numerals will be given to the same elements as those described in relation to an already mentioned drawing, and detailed description thereof may be omitted where appropriate.

Figure 1:
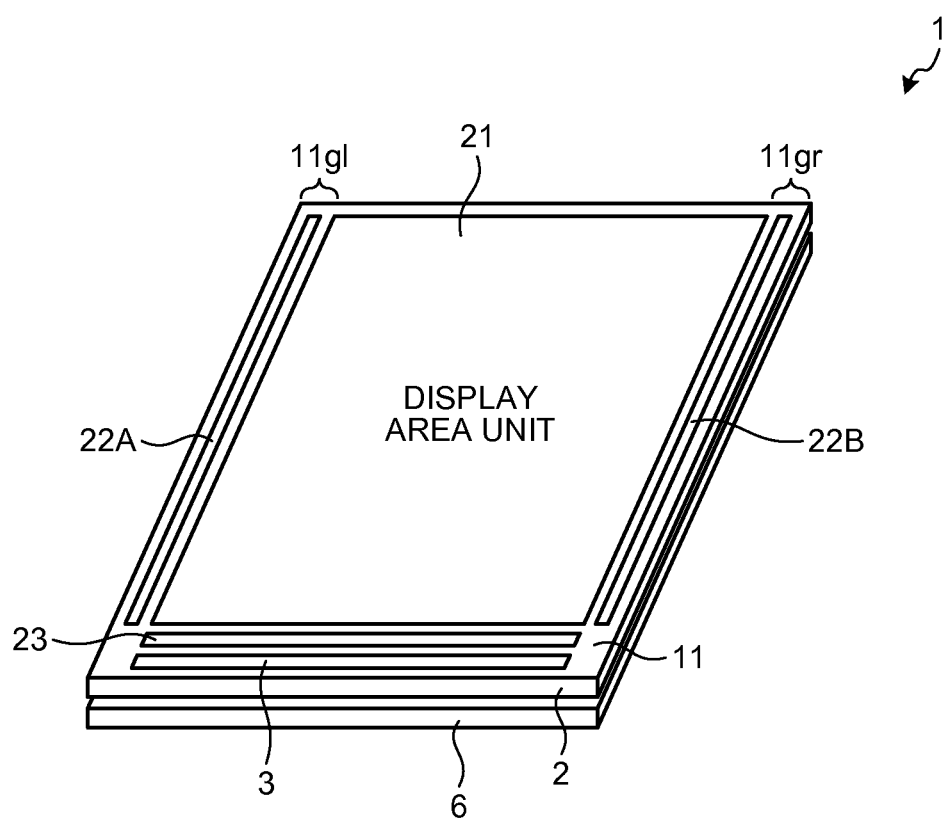
FIG. 1 is an explanatory diagram illustrating an example of a liquid crystal display device according to an embodiment of the present disclosure.
Figure 2:
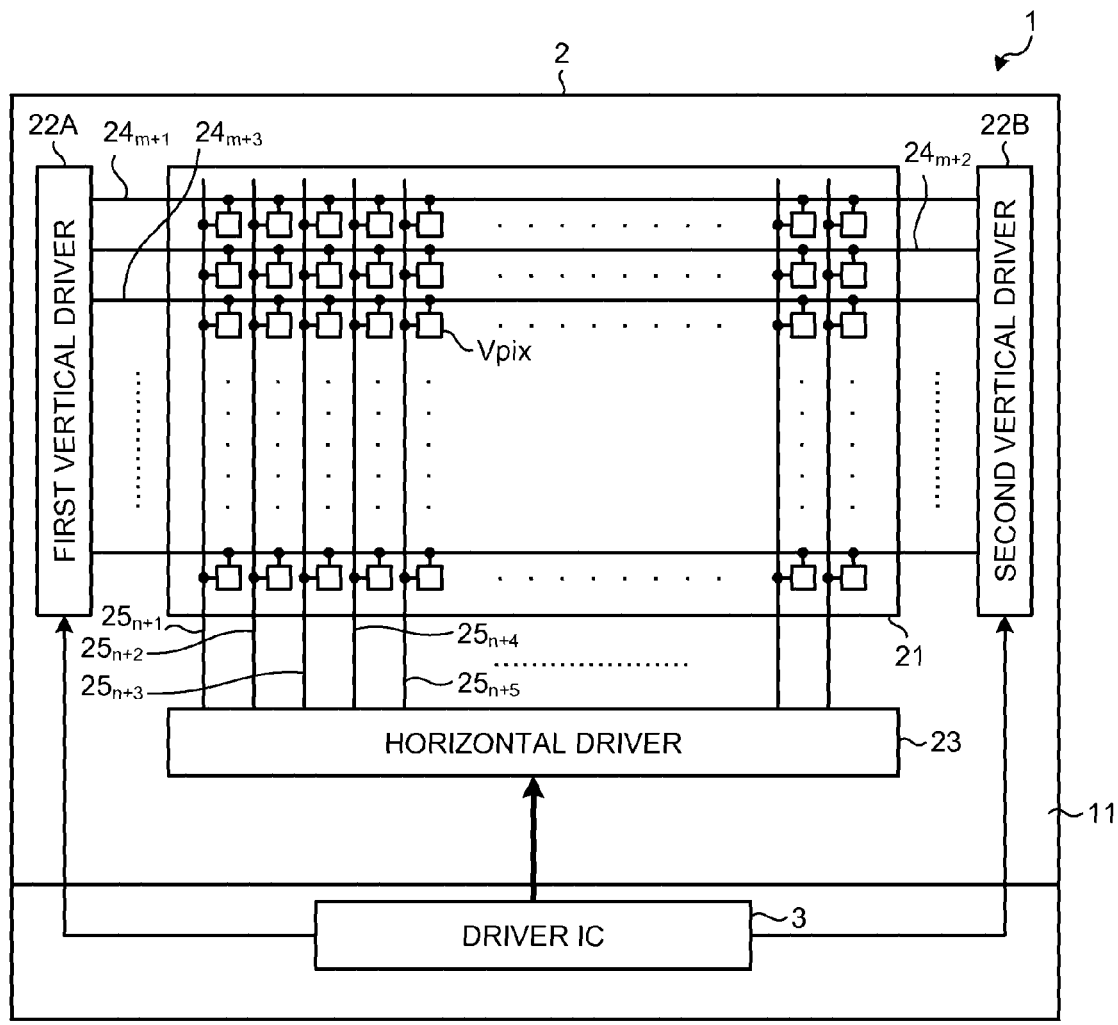
FIG. 2 is a block diagram illustrating a system example of the liquid crystal display device of FIG. 1.

FIG. 1 is an explanatory diagram illustrating an example of the liquid crystal display device according to the present embodiment. FIG. 2 is a block diagram illustrating a system example of the liquid crystal display device of FIG. 1. FIG. 1 is a schematic illustration, and does not necessarily represent actual dimensions and shapes. A display device 1 corresponds to a specific example of the "liquid crystal display device" of the present invention.

The display device 1 includes a liquid crystal display unit 2, a driver IC 3, and a backlight 6. The display apparatus 1 may be a transmissive or a transflective display apparatus, or may be a reflective display apparatus without the backlight 6. Flexible printed circuits (FPC), which are not illustrated, transmit external signals to the driver IC 3 and drive power to drive the driver IC 3. The liquid crystal display unit 2 includes a translucent insulating substrate, such as a glass substrate 11; a display area portion 21 that lies on the glass substrate 11 and includes a plurality of pixels arranged in a matrix, the pixels including liquid crystal cells; a horizontal driver (horizontal drive circuit) 23; and vertical drivers (vertical drive circuit) 22A and 22B. The vertical drivers (vertical drive circuit) 22A and 22B are arranged as the first vertical driver 22A and the second vertical driver 22B so as to have the display area portion 21 interposed therebetween. The glass substrate 11 includes a first substrate on which a plurality of pixel circuits including active elements (such as transistors) are arranged and formed in a matrix, and of a second substrate that is arranged so as to be opposed to the first substrate with a predetermined gap therebetween. The glass substrate 11 has a liquid crystal layer filled with liquid crystals between the first and the second substrates. The horizontal driver (horizontal drive circuit) 23 and the vertical drivers (vertical drive circuit) 22A and 22B are provided on the first substrate, and hence are also called peripheral circuits.

Frame edge areas 11gr and 11gl of the liquid crystal display unit 2 are non-display areas that lie outside the display area portion 21 lying on the surface of the glass substrate 11 and including the pixels arranged in a matrix, the pixels including the liquid crystal cells. The vertical drivers 22A and 22B are disposed in the frame edge areas 11gr and 11gl.

The backlight 6 is disposed on the back surface (surface on the opposite side of the surface to display an image) of the liquid crystal display unit 2. The backlight 6 emits light toward the liquid crystal display unit 2 and irradiates the whole surface of the display area portion 21 with the light. The backlight 6 includes, for example, a light source and a light guide plate that guides the light output from the light source and emits the light toward the back surface of the liquid crystal display unit 2.

The liquid crystal display unit 2 includes, on the glass substrate 11, the display area portion 21, the driver IC 3 that has functions of an interface (I/F) and a timing generator, the first vertical driver 22A, the second vertical driver 22B, and the horizontal driver 23.

In the display area portion 21, pixels Vpix including liquid crystal layers have a matrix structure in which units each constituting one pixel in terms of display are arranged in m rows×n columns. In the present specification, the row refers to a pixel row including n pixels Vpix arranged in one direction. The column refers to a pixel column including m pixels Vpix arranged in a direction orthogonal to the direction in which the row is arranged. The values of m and n are determined according to a vertical display resolution and a horizontal display resolution. For the array of the pixels Vpix of m rows and n columns in the display area portion 21, scan lines $24_1, 24_2, 24_3, \ldots, 24_m$ are wired for the respective rows, and signal lines $25_1, 25_2, 25_3, \ldots, 25_n$ are wired for the respective columns. Hereinafter, the present embodiment may represent the scan lines $24_1, 24_2, 24_3, \ldots, 24_m$ as scan lines 24 or scan lines 24m, and may represent the signal lines $25_1, 25_2, 25_3, \ldots, 25_n$ as signal lines 25 or signal lines 25n. The present embodiment may also represent the scan lines $24_1, 24_2, 24_3, \ldots, 24_m$ as scan lines $24_{m+1}, 24_{m+2}, 24_{m+3}, \ldots$ and the signal lines $25_1, 25_2, 25_3, \ldots, 25_n$ as signal lines $25_{n+1}, 25_{n+2}, 25_{n+3}, \ldots$. The display area portion 21 is disposed in an area in which the scan lines 24 and the signal lines 25 overlap a black matrix of a color filter when viewed from a direction orthogonal to a front surface. In the display area portion 21, areas in which the black matrix is not placed are open portions.

The liquid crystal display unit 2 is externally supplied with external signals, that is, a master clock, a horizontal synchronizing signal, and a vertical synchronizing signal, which are in turn supplied to the driver IC 3. The driver IC 3 convert the levels (increase the voltages) of the master clock, the horizontal synchronizing signal, and the vertical synchronizing signal having voltage amplitudes of an external power supply to voltage amplitudes of an internal power supply required to drive the liquid crystals, thus generating increased amplitude signals of the master clock, the horizontal synchronizing signal, and the vertical synchronizing signal. The driver IC 3 supplies the master clock, the horizontal synchronizing signal, and the vertical synchronizing signal thus generated to the first vertical driver 22A, the second vertical driver 22B, and the horizontal driver 23. The driver IC 3 generates, for pixel electrodes of the respective pixels Vpix, a common potential (counter electrode potential) Vcom to be given commonly to the pixels, and supplies the common potential Vcom to the display area portion 21.

The first vertical driver 22A and the second vertical driver 22B include each a shift register, a latch circuit, and so on. In each of the first vertical driver 22A and the second vertical driver 22B, the latch circuit sequentially samples and latches display data output from the driver IC 3 in one horizontal period in a manner synchronized with vertical clock pulses. The first vertical driver 22A and the second vertical driver 22B sequentially output the digital data of one line latched in each of the latch circuits as a vertical scan pulse, and supplies the digital data to each of the scan lines $24_{m+1}, 24_{m+2}, 24_{m+3}, \ldots$ of the display area portion 21 so as to sequentially select the pixels Vpix in units of rows. The first vertical driver 22A and the second vertical driver 22B are arranged so as to have the scan lines $24_{m+1}, 24_{m+2}, 24_{m+3}, \ldots$ interposed therebetween in the extending direction of the scan lines $24_{m+1}, 24_{m+2}, 24_{m+3}, \ldots$ The first vertical driver 22A and the second vertical driver 22B sequentially output the digital data to the scan lines $24_{m+1}, 24_{m+2}, 24_{m+3}, \ldots$, for example, starting from a relatively upper side in the upper direction of vertical scanning of the display area portion 21 down to a relatively lower side in the lower direction of vertical scanning of the display area portion 21. The first vertical driver 22A and the second vertical driver 22B can also sequentially output the digital data to the scan lines $24_{m+1}, 24_{m+2}, 24_{m+3}, \ldots$ starting from a relatively lower side in the lower direction of vertical scanning of the display area portion 21 up to a relatively upper side in the upper direction of vertical scanning of the display area portion 21.

The horizontal driver 23 is supplied with, for example, 6-bit digital video data Vsig of red (R), green (G), and blue (B). The horizontal driver 23 writes the display data via the signal lines 25 to the pixels Vpix of a row selected through the vertical scan by the first vertical driver 22A and the second vertical driver 22B, pixel by pixel, or a plurality of pixels at a time, or all pixels at a time.

Figure 3:
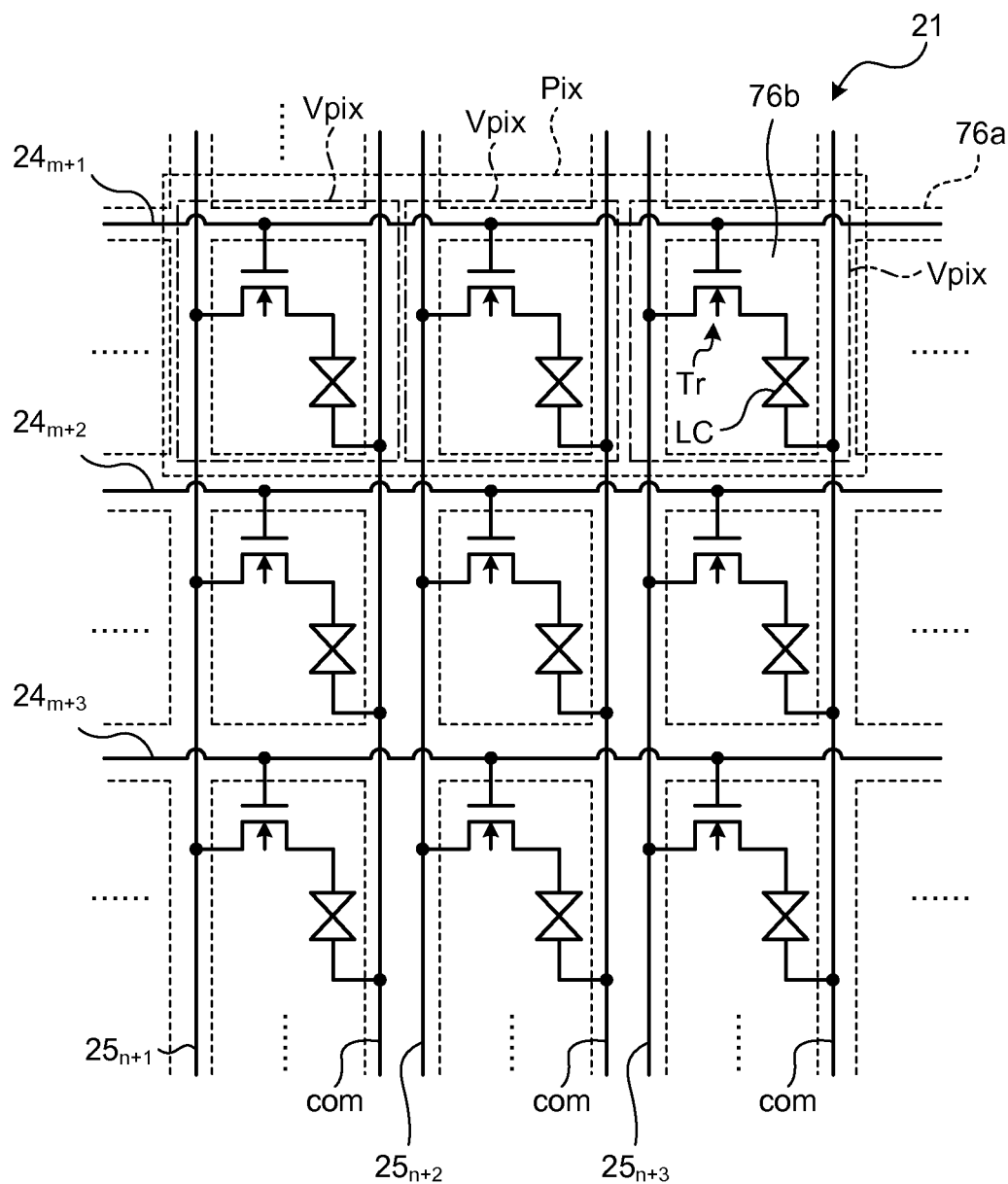
FIG. 3 is a circuit diagram illustrating an example of a drive circuit that drives pixels.

FIG. 3 is a circuit diagram illustrating an example of a drive circuit that drives pixels. The display area portion 21 is formed with the wires, such as the signal lines $25_{n+1}, 25_{n+2}, 25_{n+3}$ that supply pixel signals as the display data to thin-film transistors (TFTs) Tr of the pixels Vpix, and the scan lines $24_{m+1}, 24_{m+2}, 24_{m+3}$ that drive the TFTs Tr, as illustrated in FIG. 3. In this manner, the signal lines $25_{n+1}$, $25_{n+2}$, $25_{n+3}$ extend in a plane parallel to the surface of the glass substrate 11 described above, and supply the pixel signals for displaying an image to the pixels Vpix. The pixel Vpix includes the thin-film transistor Tr and a liquid-crystal element LC. In this example, each of the thin-film transistors Tr is constituted by an n-channel metal oxide semiconductor (MOS) TFT. One of the source and the drain of each thin-film transistor Tr is coupled to the corresponding signal line $25_{n+1}$, $25_{n+2}$, $25_{n+3}$; the gate thereof is coupled to the corresponding scan line $24_{m+1}$, $24_{m+2}$, $24_{m+3}$; and the other of the source and the drain is coupled to one end of the corresponding liquid crystal element LC. One end of the liquid crystal element LC is coupled to the corresponding thin-film transistor Tr, and the other end thereof is coupled to a common potential Vcom of a common electrode com.

The pixels Vpix are coupled to the other pixels Vpix belonging to the same row of the display area portion 21 via each of the scan lines $24_{m+1}$, $24_{m+2}$, $24_{m+3}$. The odd-numbered scan lines $24_{m+1}$, $24_{m+3}$ of the scan lines $24_{m+1}$, $24_{m+2}$, $24_{m+3}$ are coupled to the first vertical driver 22A, and are supplied from the first vertical driver 22A with a vertical scan pulse of a scan signal, to be described later. The even-numbered scan lines $24_{m+2}$, $24_{m+4}$ of the scan lines $24_{m+1}$, $24_{m+2}$, $24_{m+3}$ are coupled to the second vertical driver 22B, and supplied from the second vertical driver 22B with the vertical scan pulse of the scan signal, to be described later. In this manner, the first vertical driver 22A and the second vertical driver 22B alternately apply the vertical scan pulses to the scan lines $24_{m+1}$, $24_{m+2}$, $24_{m+3}$ in the scan direction. The pixels Vpix are coupled to the other pixels Vpix belonging to the same column of the display area portion 21 via each of the signal lines $25_{n+1}$, $25_{n+2}$, $25_{n+3}$. The signal lines $25_{n+1}$, $25_{n+2}$, $25_{n+3}$ are coupled to the horizontal driver 23, and supplied with the pixel signals from the horizontal driver 23. The common potential Vcom of the common electrode com is coupled to a drive electrode driver, which is not illustrated, and is supplied with a voltage from the drive electrode driver. The pixels Vpix are also coupled to the other pixels Vpix belonging to the same column of the display area portion 21 via the common potential Vcom of the common electrode com.

Each of the first vertical driver 22A and the second vertical driver 22B illustrated in FIGS. 1 and 2 applies the vertical scan pulse to the gates of the thin-film transistors Tr of the pixels Vpix via each of the scan lines $24_{m+1}$, $24_{m+2}$, $24_{m+3}$ illustrated in FIG. 3 so as to sequentially select one row (one horizontal line), to drive for display, of the pixels Vpix formed in a matrix in the display area portion 21. The horizontal driver 23 illustrated in FIGS. 1 and 2 supplies the pixel signals, via the signal lines $25_{n+1}$, $25_{n+2}$, $25_{n+3}$ illustrated in FIG. 3, to the respective pixels Vpix including one horizontal line sequentially selected by the first vertical driver 22A and the second vertical driver 22B. Then, these pixels Vpix of one horizontal line perform display according to the supplied pixel signals.

As described above, in the display device 1, the first vertical driver 22A and the second vertical driver 22B drive the scan lines $24_{m+1}$, $24_{m+2}$, $24_{m+3}$ to sequentially perform scanning, and thereby sequentially select one horizontal line. Also, in the display device 1, the horizontal driver 23 supplies the pixel signals to the pixels Vpix belonging to one horizontal line, and thereby, the display is performed one horizontal line at a time. When this display operation is performed, the drive electrode driver applies the common potential Vcom of the common electrode com corresponding to the horizontal line.

In the display device 1, a continuous application of direct voltage of the same polarity to the liquid-crystal element LC can cause deterioration of, for example, a specific resistance (resistance value specific to a substance) of the liquid crystal. To prevent the deterioration of, for example, the specific resistance (resistance value specific to a substance) of the liquid crystal, the display device 1 employs a driving method in which the polarity of a video signal is inverted with respect to the common potential Vcom of the drive signals at a predetermined period.

For example, column inversion, line inversion, dot inversion, and frame inversion driving methods are known as driving methods for the liquid crystal display device. The column inversion method is a driving method in which the polarity of the video signal is inverted at a period of time of 1 V (V is a vertical period) corresponding to one column (one pixel column). The line inversion driving method is a driving method in which the polarity of the video signal is inverted at a period of time of 1 H (H is a horizontal period) corresponding to one line (one pixel row). The dot inversion driving method is a driving method in which the polarity of the video signal is inverted between pixels adjacent in up-down and right-left directions. The frame inversion driving method is a driving method in which the video signals written to all pixels in one frame corresponding to one screen are inverted at once into the same polarity.

Figure 4:
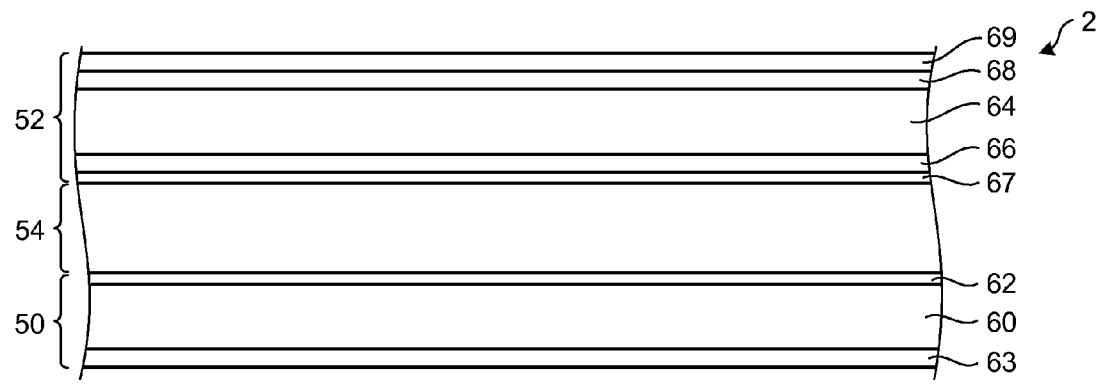
FIG. 4 is a cross-sectional view illustrating an example of a liquid crystal display unit.

A configuration of the display area portion 21 will be described in detail. FIG. 4 is a cross-sectional view illustrating an example of the liquid crystal display unit. As illustrated in FIG. 4, the liquid crystal display unit 2 includes a first substrate (upper substrate) 50, a second substrate (lower substrate) 52 disposed so as to orthogonally face a surface of the first substrate 50, and a liquid crystal layer 54 inserted between the first and the second substrates 50 and 52. The backlight 6 is disposed on a surface of the first substrate 50 opposite to the liquid crystal layer 54.

The liquid crystal layer 54 used in a liquid crystal display device modulates light passing through an electric field according to the state of the electric field, and includes liquid crystals 54 of a horizontal electric field mode, such as a fringe field switching (FFS) mode or an in-plane switching (IPS) mode. A large number of such liquid crystals 54 are dispersed in the liquid crystal layer 54.

The first substrate 50 has a pixel substrate 60 that is a translucent substrate of, for example, glass, a first alignment film 62 stacked on the liquid crystal layer 54 side of the pixel substrate 60, and a first polarizing plate 63 stacked on the side of the pixel substrate 60 opposite to the liquid crystal layer 54. The pixel substrate 60 will be described later. The first alignment film 62 aligns liquid crystal molecules in the liquid crystal layer 54 into a predetermined direction, and directly contacts the liquid crystal layer 54. The first alignment film 62 is made of, for example, a polymer material such as polyimide, and is produced, for example, by applying polyimide or the like and rubbing it. The first polarizing plate 63 has a function of directly converting light incident from the backlight 6 into linearly polarized light.

The second substrate 52 includes a counter substrate 64 that is a translucent substrate of, for example, glass, a color filter 66 provided on the liquid crystal layer 54 side of the counter substrate 64, a second alignment film 67 provided on the liquid crystal layer 54 side of the color filter 66, a retardation film 68 provided on the side of the counter substrate 64 opposite to the liquid crystal layer 54, and a second polarizing plate 69 provided on the side of the retardation film 68 opposite to the counter substrate 64. The color filter 66 includes color regions colored, for example, in the three colors of red (R), green (G), and blue (B). The color regions colored, for example, in the three colors of red (R), green (G), and blue (B) are periodically arranged at the open portions 76b of the color filter 66. One set of the color regions of the three colors of R, G, and B is associated, as a pixel Pix, with each of the pixels Vpix illustrated in FIG. 3. The color filter 66 is opposed to the liquid crystal layer 54 in a direction orthogonal to the pixel substrate 60. The color filter 66 may have a combination of other colors if colored in different colors. The color filter 66 generally gives the color region of green (G) a higher luminance than those of the color regions of red (R) and blue (B). The color filter 66 may be provided such that a black matrix 76a covers the outer circumferences of the pixels Vpix illustrated in FIG. 3. The black matrix 76a is disposed at boundaries between the two-dimensionally arranged pixels Vpix so as to have a grid shape. The black matrix 76a is formed of a material having a high rate of absorption of light.

In the same manner as the first alignment film 62, the second alignment film 67 aligns the liquid crystal molecules in the liquid crystal layer 54 into a predetermined direction, and directly contacts the liquid crystal layer 54. The second alignment film 67 is made of, for example, a polymer material such as polyimide, and is produced, for example, by applying polyimide or the like and rubbing it. The retardation film 68 has a function of compensating view angles generated at the first and the second polarizing plates 63 and 69 by the polarizing plates. The second polarizing plate 69 has a function of absorbing the linearly polarized light component parallel to the absorption axis of the polarizing plate and transmitting the orthogonal polarized light component. The second polarizing plate 69 has a function of transmitting/blocking light depending on the on/off state of liquid crystals.

Figure 5:
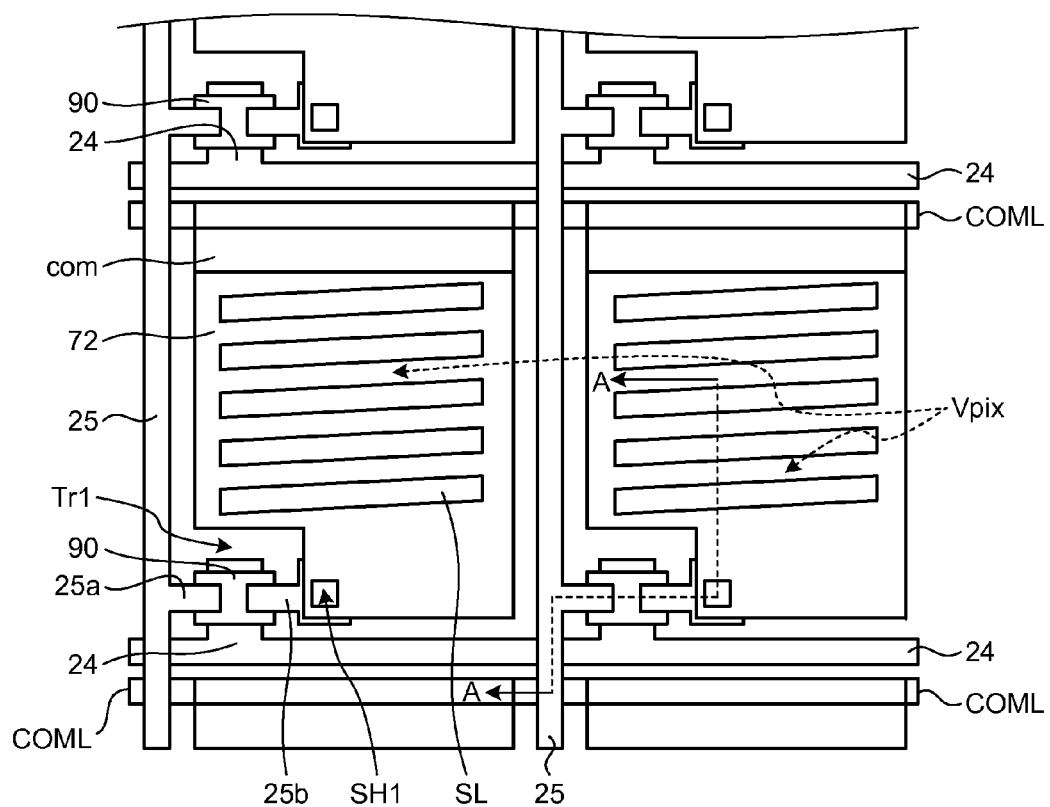
FIG. 5 is a plan view schematically illustrating pixels of the liquid crystal display device according to the present embodiment.
Figure 6:
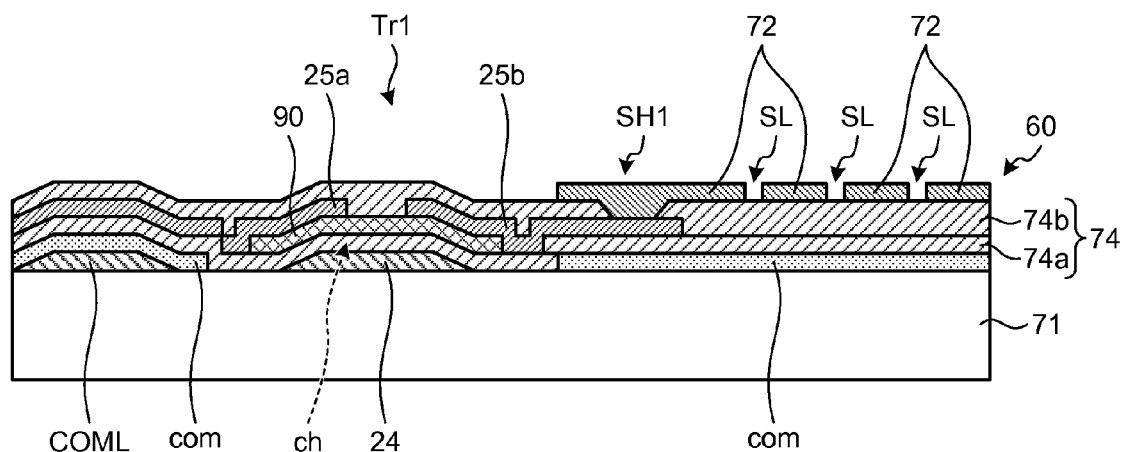
FIG. 6 is a cross-sectional view along with a broken line A-A of FIG. 5.

The pixel substrate 60 will be described using FIGS. 5 and 6. FIG. 5 is a plan view schematically illustrating pixels of the liquid crystal display device according to the present embodiment. FIG. 6 is a cross-sectional view along with a broken line A-A of FIG. 5. The pixel substrate 60 is a TFT substrate obtained by providing various circuits on a translucent substrate 71, and includes thereon a plurality of pixel electrodes 72 arranged in a matrix and the common electrode com. As illustrated in FIG. 6, the pixel electrodes 72 and the common electrode com are insulated by an insulating layer 74, and face each other in a direction orthogonal to a surface of the pixel substrate 60. The pixel electrodes 72 and the common electrode com are translucent electrodes made of a translucent conductive material (translucent conductive oxide), such as indium tin oxide (ITO).

Denoting the above described thin-film transistors Tr that are switching elements of the respective pixels Vpix as transistors Tr1, the pixel substrate 60 is obtained by stacking a semiconductor layer 90 in which the transistors Tr1 as switching elements of the respective pixels Vpix are provided, and wires, such as the signal lines 25 supplying the pixel signals to the respective pixel electrodes 72 and the scan lines 24 driving the transistors Tr1, with the insulating layer 74 interposed therebetween, on the translucent substrate 71. In the present embodiment, common potential auxiliary wiring COML is wiring that feeds the common potential Vcom to the common electrode com.

The insulating layer 74 is layered with an insulating layer (first insulating film) 74a between the scan lines 24 and the semiconductor layer 90 and an insulating layer (second insulating film) 74b between the pixel electrodes 72 and the common electrode com. More specifically, the insulating layer 74a is stacked in a position (at a layer) where portions thereof contact the translucent substrate 71 or the scan lines 24. The insulating layer 74b is stacked in a position (at a layer) where portions thereof contact the signal lines 25, the semiconductor layer 90, or a surface of the insulating film 74a. The insulating films 74a and 74b of the present embodiment are inorganic insulating layers of silicon nitride (SiNx) or silicon oxide. The insulating film 74b is made of organic insulating material, such as polyimide resin. The material constituting each layer of the insulating films 74a and 74b is not limited to this. The insulating films 74a and 74b may be made of the same insulating material, or either may be made of a different insulating material.

As illustrated in FIGS. 5 and 6, the scan lines 24 work as the gates of the transistors Tr1 by three-dimensionally crossing a part of the semiconductor layer 90. Each of the scan lines 24 three-dimensionally crosses a part of the semiconductor layer 90 at one place, and each of the transistors Tr1 is an n-channel single-gate transistor with a channel area ch. The semiconductor layer 90 is made of, for example, amorphous silicon or low-temperature polysilicon. The signal lines 25 extend in a plane parallel to a surface of the translucent substrate 71, and supply the pixel signals for displaying an image on the pixels. The semiconductor layer 90 contacts, at a part thereof, a source line 25a of each of the signal lines 25 and is electrically coupled, at another part thereof, to a drain line 25b formed in the same layer as that of the signal line 25. The drain line 25b of the present embodiment is electrically coupled to one of the pixel electrodes 72 at a through-hole SH1. In the present embodiment, the scan lines 24 are wiring of a metal, such as molybdenum (Mo) or aluminum (Al), and the signal lines 25 are wiring of a metal, such as aluminum (Al). The common potential auxiliary wiring COML is wiring of a metal, such as aluminum (Al). The pixel substrate 60 of the present embodiment is obtained by stacking the common potential auxiliary wiring COML, the scan lines 24 and the common electrode com, the insulating film 74a, the signal lines 25 and the semiconductor layer 90, the insulating film 74b, and the pixel electrodes 72, in this order, on the translucent substrate 71.

In the pixel substrate 60, openings SL are formed in the pixel electrodes 72 corresponding to the respective pixels Vpix. Of electric fields formed between the common electrode com and the pixel electrodes 72, electric fields (fringe electric fields) leaking from the openings SL of the pixel electrodes 72 drive the liquid crystals 54.

Figure 7:
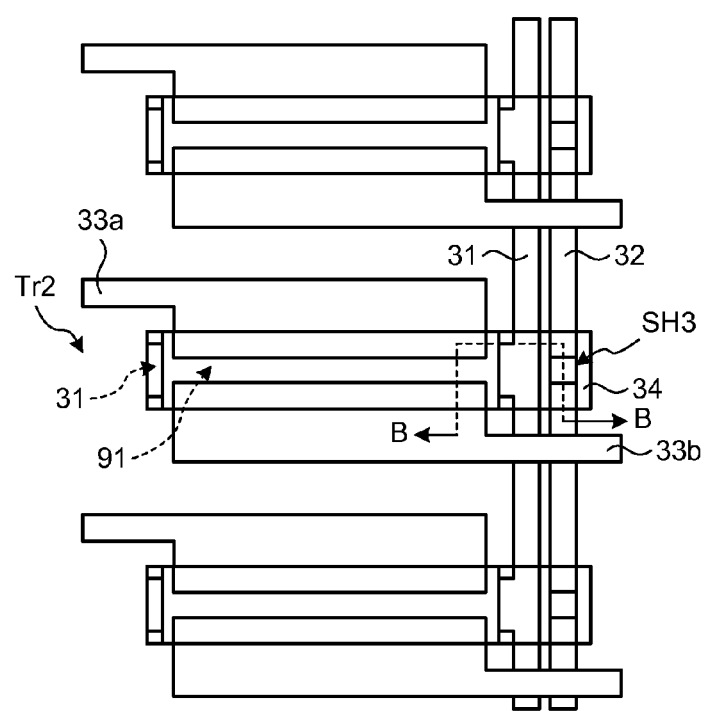
FIG. 7 is a plan view schematically illustrating a peripheral circuit of the liquid crystal display device according to the present embodiment.
Figure 8:
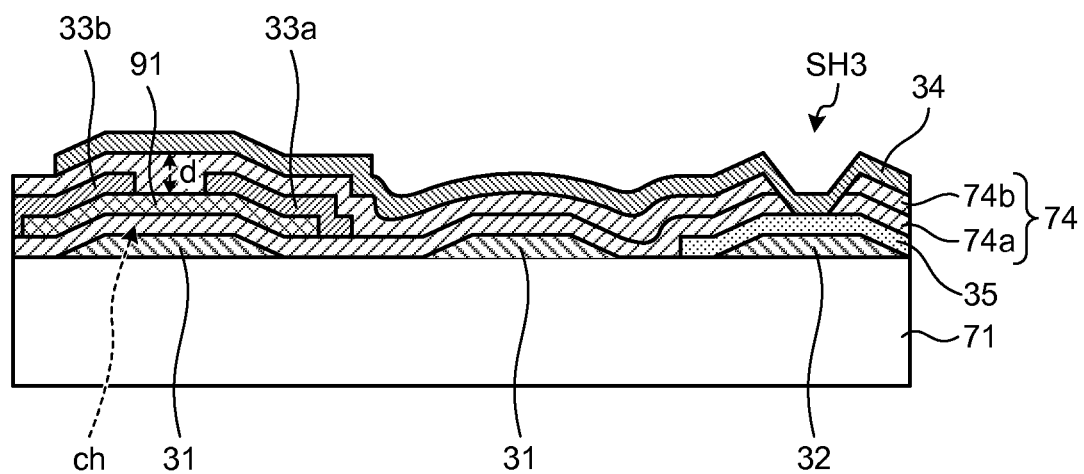
FIG. 8 is a cross-sectional view along with a broken line B-B of FIG. 7.

FIG. 7 is a plan view schematically illustrating a peripheral circuit of the liquid crystal display device according to the present embodiment. FIG. 8 is a cross-sectional view along with a broken line B-B of FIG. 7. A transistor Tr2 that is a thin-film transistor illustrated in FIG. 7 is a part of the shift register of the first vertical driver 22A or the second vertical driver 22B.

In the shift register, such transistors Tr2 are coupled in multiple stages via capacitors. For example, in each unit circuit, the transistor Tr2 generates a scan pulse by reducing the potential of a scan line to a low level (lower potential) in a predetermined time. For this purpose, lower potential wiring 32 that feeds the low-level potential (lower potential) and a peripheral circuit gate line 31 that controls the transistors Tr2 are coupled as input to the shift register. The transistor Tr2 includes a peripheral circuit source electrode 33b that is coupled to a capacitor coupled to the transistor Tr2 at a preceding stage, a peripheral circuit drain electrode 33a that is coupled to the transistor Tr2 at a subsequent stage via a capacitor, and a semiconductor layer 91. As illustrated in FIG. 8, the peripheral circuit gate line 31 works as the gate of the transistor Tr2 by three-dimensionally crossing a part of the semiconductor layer 91. The peripheral circuit gate line 31 three-dimensionally crosses a part of the semiconductor layer 91 at one place, and the transistor Tr2 is an n-channel single-gate transistor with a channel area ch. The semiconductor layer 91 is made of, for example, amorphous silicon or low-temperature polysilicon. The transistor Tr2 illustrated in FIG. 7 can be integrally molded on the translucent substrate 71 using a manufacturing process for making the thin-film transistor Tr1 in the pixel illustrated in FIG. 6. This can shorten the manufacturing process, and can reduce the size of the liquid crystal display unit 2.

Figure 9:
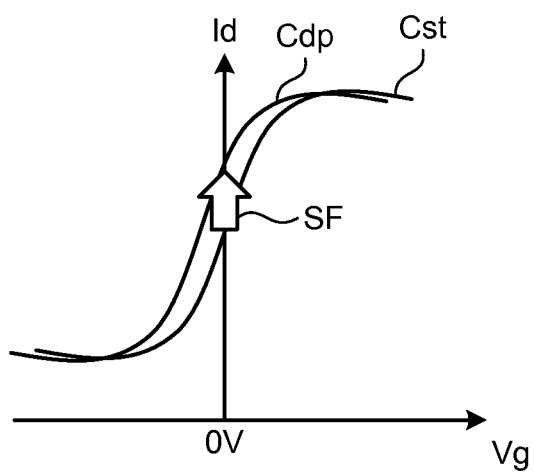
FIG. 9 is an explanatory diagram for explaining characteristics of a transistor.

The semiconductor layer 91 has characteristics called a threshold voltage shift in which a threshold voltage is changed by repeated application of a voltage to the channel area ch of the gate. In particular, when the semiconductor layer 91 is made of amorphous silicon, a large current at a potential of 0 V can increase power consumption, and prevent the circuit from operating. FIG. 9 is an explanatory diagram for explaining characteristics of a transistor. As illustrated in FIG. 9, after a thin-film transistor has operated for a long time, the threshold voltage shift (shift toward the direction of the arrow SF) can occur to shift an I-V characteristic curve Cst to an I-V curve Cdp, and can thereby increase the current at the potential of 0 V. This can cause the shift register to malfunction, causing a vertical scan pulse to scan a pixel to be improper, whereby display on the screen of the display apparatus 1 can be disturbed.

The transistor Tr2 of the present embodiment includes a conductive layer 34 that is provided on the transistor Tr2 with the inorganic insulating layer 74b interposed therebetween and covers the channel area ch, the inorganic insulating layer 74b being stacked on the transistor Tr2 in the direction orthogonal to the surface of the pixel substrate 60. To reduce the processing man-hour, the conductive layer 34 is preferably made of ITO that is simultaneously patterned and formed with the pixel electrodes 72 or the common electrode com. The conductive layer 34 is electrically coupled to the lower potential wiring 32 at a through-hole SH3. As a result, the conductive layer 34 and the semiconductor layer 91 illustrated in FIG. 8 face each other with the insulating layer 74b interposed therebetween, and a negative potential fed to the conductive layer 34 can have an effect on the operation of the channel area ch of the thin-film transistor Tr. The insulating layer 74b overlaps the channel area ch in the direction orthogonal to the surface of the pixel substrate 60, and preferably has a thickness d from 50 nm to 1000 nm. By having the thickness d of 50 nm or greater, the insulating layer 74b can assure insulation between the conductive layer 34 and the source line 25a. By having the thickness d of 1000 nm or less, the insulating layer 74b can enhance the effect of the potential fed to the conductive layer 34 on the operation of the channel area ch of the thin-film transistor Tr. Because the through-hole SH3 illustrated in FIG. 8 is formed in the same process as that of the transistor Tr1, a raised conductive layer 35 may be formed using the ITO for making the common electrode com.

Figure 10:
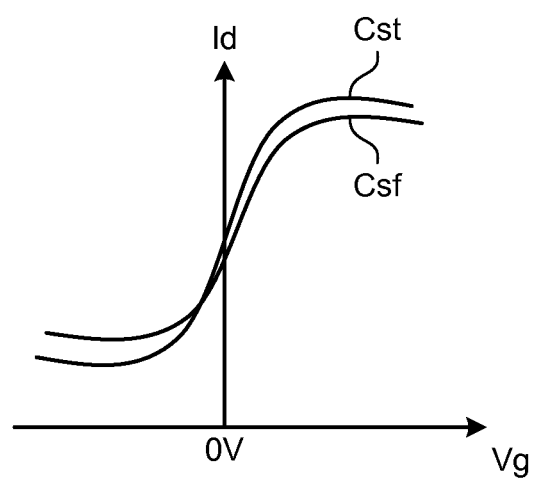
FIG. 10 is an explanatory diagram for explaining the characteristics of the transistor.

FIG. 10 is an explanatory diagram for explaining the characteristics of the transistor. As illustrated in FIG. 10, the transistor Tr2 serving as a switching element has predetermined current-voltage characteristics (I-V characteristics), and includes the conductive layer 34 that is provided on the transistor Tr2 with the inorganic insulating layer 74b interposed therebetween and covers the channel area ch, the inorganic insulating layer 74b being stacked on the thin-film transistor Tr in the direction orthogonal to the surface of the pixel substrate 60; when a negative potential is applied to the conductive layer 34, the transistor Tr2 can have I-V characteristics represented by an I-V characteristic curve Csf that is obtained by shifting in advance the I-V characteristic curve Cst obtained when no potential is applied to the conductive layer 34 so as to obtain a threshold voltage lower than that of the I-V characteristic curve Cst. This can keep the current at 0 V from increasing when the threshold voltage shift occurs that is generated by repeated application of a voltage to the channel area ch of the gate.

As described above, the display apparatus 1 according to the present embodiment includes the pixel substrate 60 serving as the first substrate, the counter substrate 64 serving as the second substrate disposed so as to face the pixel electrode 60, and the liquid crystal layer 54 disposed between the pixel substrate 60 and the counter substrate 64. The pixel substrate 60 includes the display area portion 21 in which a plurality of pixels are arranged in a matrix and the frame edge areas 11gl and 11gr that lie outside the display area portion 21. The frame edge areas 11gl and 11gr include the vertical drivers (vertical drive circuit) 22A and 22B that are the peripheral circuits that drive the pixels in the display area portion 21. The transistor Tr2 of the vertical drivers (vertical drive circuit) 22A and 22B is provided with the conductive layer 34 with the inorganic insulating layer 74b stacked on the transistor Tr2 in the direction orthogonal to the surface of the pixel substrate 60 interposed therebetween. A negative potential is applied to the conductive layer 34. The transistor Tr2 can keep the current at 0 V from increasing when the threshold voltage shift occurs that is generated by repeated application of a voltage to the channel area ch of the gate due to, for example, a prolonged operation. This leads to a reduction in malfunctions of the peripheral circuits due to prolonged operations and a reduction in display unevenness of the liquid crystal layer 54, whereby display quality of the display apparatus 1 is improved. This improves the display quality of an electronic apparatus that uses the display apparatus 1, thereby improving operability thereof.

When a negative potential is applied to the conductive layer 34, wiring dedicated to feeding power to the conductive layer 34 may be provided. As described above, the use of the lower potential wiring 32 of the present embodiment can eliminate the wiring dedicated to feeding power to the conductive layer 34, and thereby can reduce the frame edge areas that do not contribute to display.

While the pixel electrodes 72 of the present embodiment lie on the side nearer to the liquid crystal layer 54 than the common electrode com, the arrangement is not limited to this form. The common electrode com may lie on the side nearer to the liquid crystal layer 54 than the pixel electrodes 72. In the case of this other form, the openings SL are formed in the common electrode com corresponding to the respective pixels Vpix in the pixel substrate 60. Hence, of electric fields formed between the common electrode com and the pixel electrodes 72, electric fields (fringe electric fields) leaking from the openings SL of the common electrode com drive the liquid crystals 54. Employing such a structure eliminates the need for providing the common potential auxiliary wiring COML disposed in the present embodiment. This can lead to improvement in the aperture efficiency.

Application Examples

Next, with reference to FIG. 11, a description will be made of application examples of the display device 1 described in the embodiment. FIG. 11 is a diagram illustrating an example of the electronic apparatus to which the liquid crystal display device according to the present embodiment is applied. The display device 1 according to the present embodiment can be applied to electronic apparatuses of all fields, such as automotive navigation systems, television devices, digital cameras, notebook type personal computers, mobile terminal devices including mobile phones, and video cameras. In other words, the display device 1 according to the present embodiment can be applied to electronic apparatuses of all fields that display externally received video signals or internally generated video signals as images or video pictures. The electronic apparatus includes a control device that supplies the video signals to the liquid crystal display device, and controls operations of the liquid crystal display device.

The electronic apparatus illustrated in FIG. 11 is an automotive navigation device to which the display device 1 according to the present embodiment is applied. The display apparatus 1 is installed on a dashboard 300 in the interior of an automobile. Specifically, the display apparatus 1 is installed between a driver seat 311 and a front passenger seat 312 on the dashboard 300. The display apparatus 1 of the automotive navigation device is used for, for example, navigation display, display of a music operation screen, or movie reproduction display.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Aspect of Present Disclosure

The present disclosure includes aspects as follows.

(1) A liquid crystal display device including a first substrate, a second substrate disposed so as to face the first substrate and a liquid crystal layer disposed between the first and the second substrates,
the first substrate including:
a display area portion in which a plurality of pixels are arranged in a manner of a matrix; and
a frame edge area lying outside the display area portion, the frame edge area including a peripheral circuit configured to drive the plurality of pixels of the display area portion, the peripheral circuit having at least one transistor,
wherein a channel area of the transistor is covered with a conductive layer via an inorganic insulating layer, the inorganic insulating layer and the conductive layer being stacked in a direction orthogonal to a surface of the first substrate in the stated order, and
a predetermined negative potential is applied to the conductive layer.

(2) The liquid crystal display device set forth (1), wherein
the first substrate includes a plurality of scan lines for scanning the plurality of pixels, and
the predetermined negative potential is a lower potential of scan pulses applied to the plurality of scan lines in a time divisional manner.

(3) An electronic apparatus comprising:
the liquid crystal display device set forth in (1); and a control device configured to supply an image signal to the liquid crystal display device, and configured to control operations of the liquid crystal display device.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A liquid crystal display device comprising:
a first substrate;
a second substrate disposed so as to face the first substrate;
a liquid crystal layer disposed between the first and the second substrates;
wherein the first substrate includes
a display area portion in which a plurality of pixels are arranged in a manner of a matrix, and
a frame edge area lying outside the display area portion,
a peripheral circuit that is disposed in the frame edge area and configured to drive the plurality of pixels of the display area portion, the peripheral circuit having at least one transistor
having a channel area;
a lower potential wiring that is disposed in the frame edge area and is configured to apply a predetermined negative potential to the peripheral circuit; and
a peripheral circuit gate line that is disposed in the frame edge area and connected to the peripheral circuit to drive the transistor,
wherein an inorganic insulating layer and a conductive layer are stacked on the transistor in a direction orthogonal to a surface of the first substrate, and
wherein the predetermined negative potential is applied by the lower potential wiring through a through hole to the conductive layer that covers the channel area of the transistor.

2. The liquid crystal display device set forth claim 1, wherein
the first substrate includes a plurality of scan lines for scanning the plurality of pixels, and
the predetermined negative potential is a lower potential of scan pulse voltages applied to the plurality of scan lines.

3. An electronic apparatus comprising:
the liquid crystal display device set forth in claim 1; and
a control device configured to supply an image signal to the liquid crystal display device, and configured to control operations of the liquid crystal display device.

* * * * *